United States Patent
Peng et al.

(10) Patent No.: US 7,365,989 B2
(45) Date of Patent: Apr. 29, 2008

(54) HEAT DISSIPATING DEVICE FOR COMPUTER ADD-ON CARDS

(75) Inventors: Xue-Wen Peng, Shenzhen (CN); Rui-Hua Chen, Shenzhen (CN); Jun-Hai Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 220 days.

(21) Appl. No.: 11/308,134

(22) Filed: Mar. 8, 2006

(65) Prior Publication Data
US 2007/0211432 A1    Sep. 13, 2007

(51) Int. Cl.
*H05K 7/20* (2006.01)

(52) U.S. Cl. ............ 361/720; 361/695; 361/719; 361/720; 165/80.3; 165/104.33; 165/185

(58) Field of Classification Search ........... 361/695, 361/719, 720; 257/712, 714–720; 165/80.3, 165/80.4, 104.26, 121, 104.33; 174/15.2; 417/423.7

See application file for complete search history.

(56) References Cited

U.S. PATENT DOCUMENTS

| 6,023,413 | A  | * | 2/2000  | Umezawa        | 361/697  |
| 6,452,797 | B1 | * | 9/2002  | Konstad        | 361/695  |
| 6,549,404 | B1 | * | 4/2003  | Kitahara et al.| 361/695  |
| 6,567,269 | B2 | * | 5/2003  | Homer et al.   | 361/700  |
| 6,593,673 | B1 | * | 7/2003  | Sugai et al.   | 307/116  |
| 6,671,177 | B1 | * | 12/2003 | Han            | 361/719  |
| 6,717,811 | B2 |   | 4/2004  | Lo et al.      |          |
| 6,778,390 | B2 | * | 8/2004  | Michael        | 361/695  |
| 7,142,422 | B2 | * | 11/2006 | Lee et al.     | 361/695  |
| 7,193,849 | B2 | * | 3/2007  | Xu et al.      | 361/695  |
| 7,209,356 | B2 | * | 4/2007  | Lee et al.     | 361/719  |
| 7,254,023 | B2 | * | 8/2007  | Lu et al.      | 361/698  |
| 7,283,364 | B2 | * | 10/2007 | Refai-Ahmed et al. | 361/719 |
| 2004/0042171 | A1 | * | 3/2004 | Takamatsu et al. | 361/687 |
| 2005/0007738 | A1 | * | 1/2005 | Inoue          | 361/695  |
| 2005/0244291 | A1 | * | 11/2005 | Tomioka et al.| 417/423.7|

* cited by examiner

*Primary Examiner*—Boris Chervinsky
*Assistant Examiner*—Courtney L Smith
(74) *Attorney, Agent, or Firm*—Jeffrey T. Knapp

(57) ABSTRACT

A heat dissipating device mounted onto a VGA card (10) includes a base (22) contacting with a GPU (12) attached on the VGA card, a cover (21) mounted on the base, and a plurality of fins (24) received between and thermally connecting the cover and the base. The base defines a slot (222) above the GPU. A fan (28) is positioned on the base for driving an airflow, wherein one portion of the airflow flows through the fins and another portion of the airflow flows through the slot and blows over other electronic components near to the GPU. Thus, rebounding of the airflow is reduced, and the heat dissipating device has better heat dissipating efficiency.

18 Claims, 3 Drawing Sheets

HEAT DISSIPATING DEVICE FOR COMPUTER ADD-ON CARDS

FIELD OF THE INVENTION

The present invention relates to a heat dissipating device for computer add-on cards and particularly a heat dissipating device mounted onto a VGA (video graphic array) card for dissipating heat generated by the VGA card.

DESCRIPTION OF RELATED ART

In order to enable desktop and other computers to rapidly process graphics and game technology, add-on units, generally referred to as "graphics cards" or "VGA cards", are often installed in computer devices. Such cards include a separate processor, called a GPU (graphics processor unit). The GPU generates a large amount of heat during operation. When the temperature of the GPU exceeds a certain level, the GPU may malfunction, or in the worst case fail outright. For this reason, a heat sink is commonly required to be installed on the GPU to dissipate the heat generated by the GPU and other electronic components adjacent to it into ambient air. Generally, the heat sink comprises a base and a plurality of fins mounted on the base. The base is attached on the GPU mounted on the VGA card so as to absorb the heat. A fan is installed at a lateral side of the fins to blow air through a channel of the fins, thereby taking heat away from there. Although cool air is blown onto the fins by the fan, most of the air can not fully utilized and continuously bounces around in a small and restricted space, so that the air often does not directly blow onto the GPU or the other electronic components adjacent to it and cooling efficiency of the fan is thus impaired.

SUMMARY OF INVENTION

According to a preferred embodiment of the present invention, a heat dissipating device mounted onto a VGA card comprises a base contacting with a GPU attached on the VGA card, a cover mounted on the base, and a plurality of fins both received between and thermally connecting with the cover and the base. The base defines a slot above the GPU. A fan is positioned on the base for driving an airflow, wherein one portion of the airflow flows through the fins and another portion of the airflow flows through the slot and blows over other electronic component near to the GPU. Thus, rebounding of the airflow is reduced, and the heat dissipating device has a better heat dissipating efficiency.

Other advantages and novel features of the present invention will become more apparent from the following detailed description of preferred embodiment when taken in conjunction with the accompanying drawings, in which:

DETAILED DESCRIPTION

Figure 1:
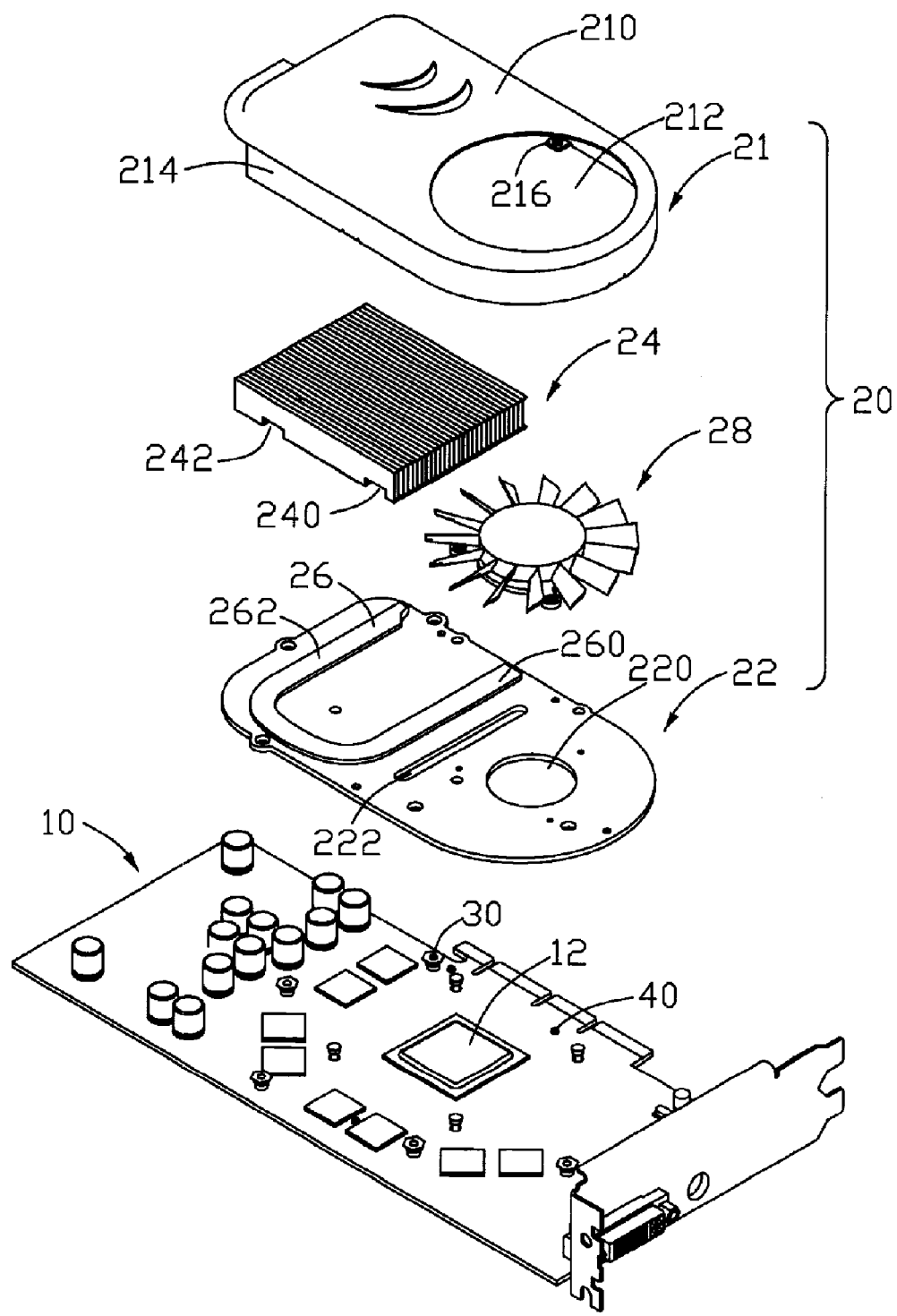
FIG. 1 is an exploded, isometric view of a heat dissipating device according to a preferred embodiment of the present invention, and a VGA card.
Figure 2:
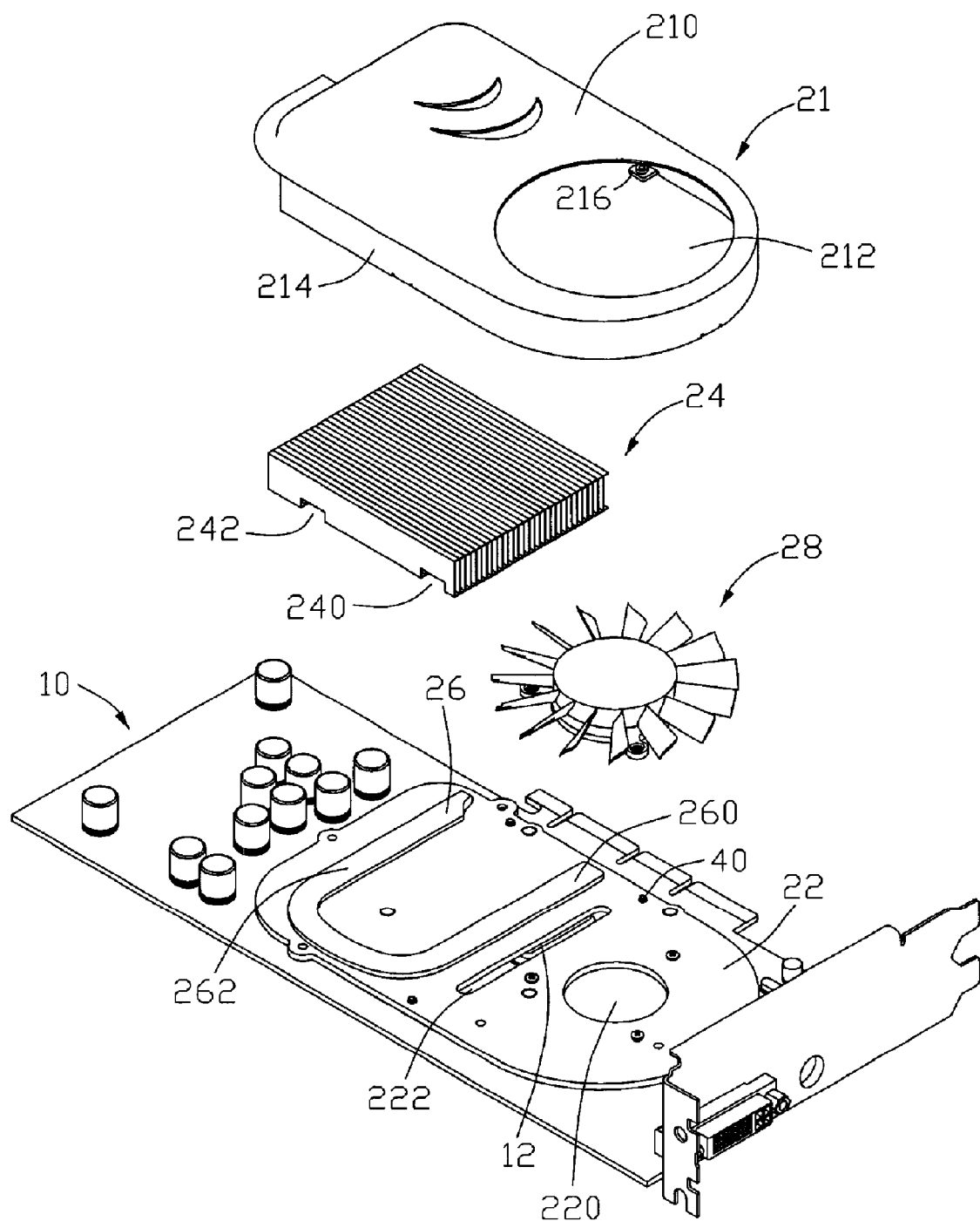
FIG. 2 is a partly assembled view of FIG. 1.

Referring to FIGS. 1-2, a heat dissipating device 20 in accordance with a preferred embodiment of the present invention is illustrated. The heat dissipating device 20 is mounted onto a VGA card 10 for dissipating heat generated by a graphic processing unit (GPU) 12 of the VGA card 10.

The heat dissipating device 20 mainly comprises a base 22, a plurality of fins 24 soldered to the base 22, a flattened heat pipe 26 positioned between the base 22 and a bottom portion of the fins 24, a fan 28 located on the base 22 and adjacent to channels of the fins 24, and a cover 21 mounted onto the base 22 and covering the fins 24, the fan 28 and the heat pipe 26.

The base 22 is secured to the VGA card 10 by a plurality of suitable fasteners 30. The heat pipe 26 has a U-shaped configuration, and is soldered on the base 70. A round opening 220 is defined in the base 22. The fan 28 is mounted on the base 22 and is aligned with the opening 220. An airflow generated by the fan 28 flows through channels formed by the fins 24 to dissipate heat absorbed by the fins 24. Each fin 24 is a single metal piece, and defines first and second rectangular grooves 240, 242 at a bottom portion thereof, wherein the first groove 240 is located closer to the fan 28 than the second groove 242 for receiving an evaporating portion 260 of the heat pipe 26. The base 22 defines an elongated slot 222 located between the evaporating portion 260 of the heat pipe 26 and the fan 28. The slot 222 is above and adjacent to the GPU 12 for providing passage of a portion of the airflow generated by the fan 28 and reducing a rebound of the airflow.

The heat pipe 26 is sandwiched between the base 22 and the bottom portion of the fins 24. The heat pipe 26 is filled with working fluid therein and has one end forming the evaporating portion 260 located in the first groove 240 of the fins 24 and another end forming a condensing portion 262 located in the second groove 242 of the fins 24. The GPU 12 of the VGA card 10 engages a bottom face of the base 22 directly below the evaporating portion 260 of the heat pipe 26. When the evaporating portion 260 absorbs heat from the GPU 12 of the VGA card 10, the working fluid in the evaporating portion 260 becomes vapor. The vapor flows to the condensing portion 262 of the heat pipe 26 and is cooled and condensed into liquid. The condensed working fluid flows back to the evaporating portion 260 by capillary effect along an inner wall of the heat pipe 26 to complete a heat discharging cycle in the heat pipe 26. Thereafter, the cycle is continuously repeated.

The cover 21 has a shape similar to that of the base 22, and comprises a top wall 210 spaced from the base 22 and a sidewall 214 extending downwardly from an edge of the top wall 210. The top wall 210 defines an intake 212 therein. The intake 212 is aligned with the fan 28. The top wall 210 of the cover 21 is soldered onto the fins 24 so that the fins 24 and the top wall 210 of the cover 21 are thermally connected together. The sidewall 214 forms a plurality of tabs 216 extending perpendicularly and inwardly from an edge thereof. A plurality of screws 40 extends through the VGA card 10 and the base 22 and threadedly engages with the tabs 216 of the cover 21, whereby the heat dissipating device 20 is securely fixed to the VGA card 10.

Figure 3:
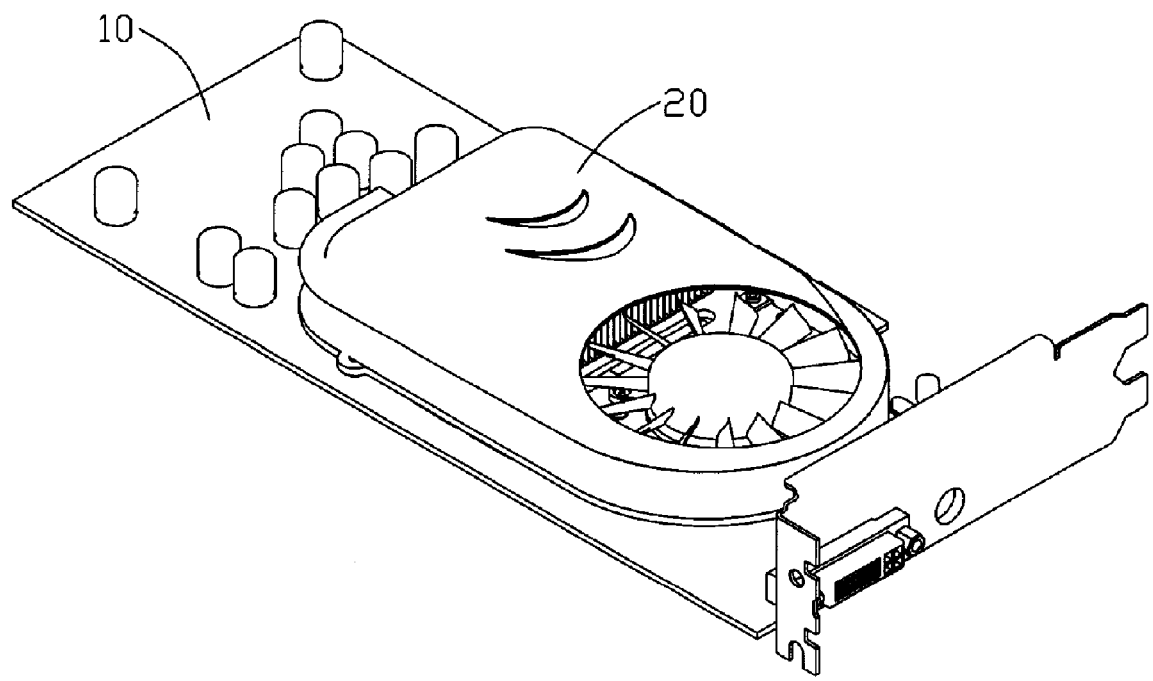
FIG. 3 is an assembled view of FIG. 1.

Also referring to FIG. 3, the fins 24, the fan 28 and the cover 21 are installed on the base 22. The heat absorbed by the base 22 is distributed over the base 22 along the heat pipe 26, and is simultaneously transferred to the fins 24 and dissipated to ambient air via the fins 24. Meanwhile, one portion of airflow generated by the fan 28 flows through the fins 24 to take the heat away from the fins 24, and another portion of airflow flows through the slot 222 and blows over other electronic components near to the GPU 12 to reduce the rebound of the airflow. Heat generated by the GPU 12 of the VGA card 10 is thus sufficiently dissipated to the ambient air, and accordingly, the VGA card 10 can operate stably and have an extended life of use. In the present invention, the airflow generated by the fan 28 is drawn from the intake 212, and blown to the fins 24 and other electronic components near to the GPU 12. Accordingly, the heat dissipation efficiency of the heat dissipating device 20 is improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device adapted for dissipating heat generated by an add-on card, comprising:
    a base located on the add-on card and contacting with a chipset attached on the add-on card, for dissipating heat generated by the chipset, the base defining a slot therein, the slot being above and adjacent to the chipset;
    a cover attached on the base and having a top wall spaced from the base;
    a plurality of fins thermally connecting the cover and the base; and
    a fan positioned on a surface of the base for driving an airflow; the slot is located on the surface of the base between the fins and the fan; a heat pipe is mounted on the surface of the base, and thermally connects with the base and the fins, wherein one portion of the airflow flows through the fins and another portion of the airflow flows through the slot and blows other electronic components near the chipset.

2. The heat dissipating device as described in claim 1, wherein the heat pipe is U-shaped and flattened.

3. The heat dissipating device as described in claim 2, wherein the heat pipe comprises an evaporating portion and a condensing portion parallel to the evaporating portion, wherein the evaporating portion of the heat pipe is located closer to the slot than the condensing portion.

4. The heat dissipating device as described in claim 3, wherein the slot is located between the evaporating portion of the heat pipe and the fan.

5. The heat dissipating device as described in claim 1, wherein the cover comprises a top wall and a sidewall extending downwardly from an edge of the top portion, an intake is defined in the top wall and is in substantial alignment with the fan.

6. The heat dissipating device as described in claim 5, wherein a plurality of tabs is formed on the sidewall of the cover, and a plurality of screws extends through the add-on card and the base and threadedly engages with the tabs of the cover for fastening the heat dissipating device to the add-on card.

7. A heat dissipating device for an add-on card comprising:
    a base for being mounted to the add-on card and thermally connecting with a heat source of the add-on card, the base defining a slot above the heat source;
    a heat sink mounted on the base;
    a fan mounted on the base for driving an airflow through the heat sink and the slot, wherein the slot is located on a surface of the base between the fins and the fan;
    a cover mounted on the base and thermally connecting with the heat sink; and
    a heat pipe mounted on the surface of the base thermally connecting with the base and the heat sink.

8. The heat dissipating device as described in claim 7, wherein base defines an opening being in substantial alignment with the fan.

9. The heat dissipating device as described in claim 7, wherein the heat pipe comprises an evaporating portion and a condensing portion, the evaporating portion of the heat pipe is located closer to the fan than the condensing portion.

10. The heat dissipating device as described in claim 9, wherein the slot is located between the evaporating portion and the fan, for permitting passage of a portion of the airflow to blow over other electronic components near the heat source of the add-on card.

11. The heat dissipating device as described in claim 10, wherein the slot is elongated.

12. The heat dissipating device as described in claim 7, wherein the heat pipe is U-shaped and flattened.

13. The heat dissipating device as described in claim 7, wherein the heat pipe is sandwiched between the base and a bottom portion of the heat sink.

14. The heat dissipating device as described in claim 7, wherein the cover comprises a top wall and a sidewall extending downwardly from an edge of the top portion, an intake is defined in the top wall and is in substantial alignment with the fan.

15. The heat dissipating device as described in claim 14, wherein a plurality of tabs is formed on the sidewall of the cover, and a plurality of screws extends through the add-on card and the base and threadedly engages with the tabs of the cover for fastening the heat dissipating device to the add-on card.

16. A computer add-on card assembly comprising:
    an add-on card having a heat-generating electronic component mounted thereon;
    a heat dissipating device mounted on the add-on card, comprising:
    a base in thermal connection with the heat-generating electronic component a surface of the, base defining a void therethrough;
    a heat pipe mounted on the surface of the base and thermally connecting with the base;
    a fin assembly mounted on the base and the heat pipe and thermally connecting with the base and the heat pipe; and
    a fan rotatably mounted on the base;
    wherein the void is located between the heat pipe and the fan and an airflow generated by the fan has a portion flowing to the fin assembly and another portion flowing to the add-on card through the void.

17. The add-on card assembly as described in claim 16, wherein the void is located adjacent to a top of the heat-generating electronic component.

18. The add-on card assembly as described in claim 17, wherein the void is an elongated slot.

* * * * *